(12) United States Patent
Tsukahara et al.

(10) Patent No.: US 11,187,724 B2
(45) Date of Patent: Nov. 30, 2021

(54) CURRENT MEASURING DEVICE AND CURRENT SENSING RESISTOR

(71) Applicant: KOA CORPORATION, Ina (JP)

(72) Inventors: Takeharu Tsukahara, Nagano (JP); Takanori Kikuchi, Nagano (JP)

(73) Assignee: KOA CORPORATION, Nagano (JP)

( * ) Notice: Subject to any disclaimer, the term of this patent is extended or adjusted under 35 U.S.C. 154(b) by 143 days.

(21) Appl. No.: 16/485,030

(22) PCT Filed: Jan. 31, 2018

(86) PCT No.: PCT/JP2018/003066
§ 371 (c)(1),
(2) Date: Aug. 9, 2019

(87) PCT Pub. No.: WO2018/150869
PCT Pub. Date: Aug. 23, 2018

(65) Prior Publication Data
US 2020/0011899 A1 Jan. 9, 2020

(30) Foreign Application Priority Data
Feb. 14, 2017 (JP) .............................. JP2017-025386

(51) Int. Cl.
*G01R 1/20* (2006.01)
*H01C 1/014* (2006.01)
*G01R 19/00* (2006.01)

(52) U.S. Cl.
CPC ............. *G01R 1/203* (2013.01); *H01C 1/014* (2013.01); *G01R 19/0092* (2013.01)

(58) Field of Classification Search
CPC .......... G01R 1/203; H01C 1/014; H01C 1/14; H01C 7/13; H01C 7/06
See application file for complete search history.

(56) References Cited

U.S. PATENT DOCUMENTS

| | | | |
|---|---|---|---|
| 2003/0038706 A1* | 2/2003 | Nakatsu | H02M 7/003 338/49 |
| 2005/0258930 A1* | 11/2005 | Ishida | H01C 1/144 338/309 |
| 2006/0158304 A1 | 7/2006 | Moriya | |

(Continued)

FOREIGN PATENT DOCUMENTS

| | | |
|---|---|---|
| CN | 1726565 A | 1/2006 |
| CN | 102696079 A | 9/2012 |

(Continued)

*Primary Examiner* — Dominic E Hawkins
(74) *Attorney, Agent, or Firm* — Crowell & Moring LLP (57) ABSTRACT

Provided is a current sensing resistor including a plate-shaped resistive element containing a resistive material, and plate-shaped electrodes joined to opposite sides of the plate-shaped resistive element, each plate-shaped electrode containing an electrode material. Each electrode includes an upper electrode portion that is substantially flush with the resistive element, a lower electrode portion to be mounted on a wire pattern, and a step portion located between the upper electrode portion and the lower electrode portion. The upper electrode portion is wider than the resistive element and the lower electrode portion in the direction orthogonal to the direction in which the electrodes are arranged.

2 Claims, 6 Drawing Sheets

(56) References Cited

U.S. PATENT DOCUMENTS

| | | | | |
|---|---|---|---|---|
| 2009/0174522 A1* | 7/2009 | Schulz | .................... | H01C 1/08 |
| | | | | 338/49 |
| 2014/0125429 A1* | 5/2014 | Yoshioka | ............... | G01R 1/203 |
| | | | | 333/172 |
| 2014/0266568 A1* | 9/2014 | Cheng | .................... | H01C 7/003 |
| | | | | 338/314 |
| 2015/0212115 A1* | 7/2015 | Nakamura | ............... | H01C 1/14 |
| | | | | 338/332 |
| 2016/0231359 A1 | 8/2016 | Nakamura et al. | | |
| 2016/0240288 A1 | 8/2016 | Chiku et al. | | |
| 2017/0122985 A1* | 5/2017 | Umezawa | ............... | G01R 1/203 |
| 2017/0192038 A1* | 7/2017 | Kawamoto | ............. | G01R 1/203 |
| 2017/0307658 A1 | 10/2017 | Chiku et al. | | |
| 2021/0020339 A1 | 1/2021 | Smith et al. | | |

FOREIGN PATENT DOCUMENTS

| | | |
|---|---|---|
| CN | 105683764 A | 6/2016 |
| CN | 105684105 A | 6/2016 |
| WO | WO 2016/063928 A1 | 4/2016 |

\* cited by examiner

CURRENT MEASURING DEVICE AND CURRENT SENSING RESISTOR

RELATED APPLICATIONS

This is a 371 application of PCT/JP2018/003066 having an international filing date of Jan. 31, 2018, which claims priority to JP2017-025386 filed Feb. 14, 2017, the entire content of each of which is incorporated herein by reference:

TECHNICAL FIELD

The present invention relates to a current sensing technique.

BACKGROUND ART

It is well known that a chip resistor with quite a low resistance value, which is on the order of millions, is commonly used to sense a current. A chip resistor includes, for example, a resistive element formed from a noble metal alloy or other metal alloys, highly conductive electrodes, and a meltable solder material.

Patent Literature 1 below discloses a mount structure of a current sensing resistor.

CITATION LIST

Patent Literature

Patent Literature 1: WO 2016/063928 A

SUMMARY OF INVENTION

Technical Problem

According to the technique disclosed in Patent Literature 1 above, when a current is sensed by mounting a small shunt resistor on a wire pattern, the influence of generation of electromigration and the like on the current sensing accuracy can be suppressed.

By the way, when a voltage is sensed from a shunt resistor through wire bonding, bonding wires are welded to the shunt resistor. There has been a tendency that depending on the welding positions, the temperature characteristics would deteriorate due to the influence of TCR of the electrodes (e.g., Cu).

To minimize the influence of TCR of the Cu electrodes, it would be necessary to fix bonding wires to the respective electrodes at positions as close to the resistive element as possible.

However, there has been a problem that the portion where the resistive element and each electrode are welded together has a surface state that is not suitable for wire bonding due to the influence of welding spots, for example.

It is an object of the present invention to suppress the influence of TCR of electrode portions of a shunt resistor. It is another object of the present invention to suppress the influence of welding spots on wire bonding.

Solution to Problem

According to an aspect of the present invention, there is provided a current sensing resistor including a plate-shaped resistive element containing a resistive material, and plate-shaped electrodes joined to opposite sides of the plate-shaped resistive element, each plate-shaped electrode containing an electrode material, in which each electrode includes an upper electrode portion that is substantially flush with the resistive element, a lower electrode portion to be mounted on a wire pattern, and a step portion located between the upper electrode portion and the lower electrode portion, and the upper electrode portion is wider than the resistive element and the lower electrode portion in a direction orthogonal to a direction in which the electrodes are arranged.

Increasing the width of an area of each electrode at a position closer to the resistive element can reduce the resistance of the electrode at a position where wire bonding is to be performed. Thus, it is possible to reduce the contribution of the resistance value of each electrode portion to the resistance value of the entire shunt resistor and thus suppress the influence of TCR of the electrode portion (i.e., improve the temperature characteristics).

The width of the resistive element is preferably greater than or equal to the width of the lower electrode portion in the direction orthogonal to the direction in which the upper electrode portion is arranged.

A recess portion that includes at least a part of the resistive element may be formed on a side of the current sensing resistor, and the depth of the recess portion preferably does not reach an imaginary line connecting opposite side faces of the lower electrode portion.

The present invention provides a current measuring device including a current sensing resistor, a wire pattern, and a bonding wire, in which the current sensing resistor includes a plate-shaped resistive element containing a resistive material, and plate-shaped electrodes joined to opposite sides of the plate-shaped resistive element, each plate-shaped electrode containing an electrode material, each electrode includes an upper electrode portion that is substantially flush with the resistive element, a lower electrode portion to be mounted on a wire pattern, and a step portion located between the upper electrode portion and the lower electrode portion, the upper electrode portion is wider than the resistive element and the lower electrode portion in a direction orthogonal to a direction in which the electrodes are arranged, the wire pattern has the lower electrode portion securely mounted thereon and is adapted to pass a target current to be sensed, the bonding wire is fixed to the upper electrode portion at a position near the resistive element, and the upper electrode portion is wide in an area of from a bonding portion having the bonding wire is fixed thereto to the step portion.

The present specification incorporates the disclosure of JP Patent Application No. 2017-025386 that forms the basis of the priority claim of the present application.

Advantageous Effects of Invention

According to the present invention, the influence of TCR of electrode portions of a shunt resistor can be suppressed. In addition, the influence of welding spots on wire bonding can be suppressed.

DESCRIPTION OF EMBODIMENTS

Hereinafter, an embodiment of the present invention will be described in detail with reference to the drawings.

First Embodiment

Figure 1:
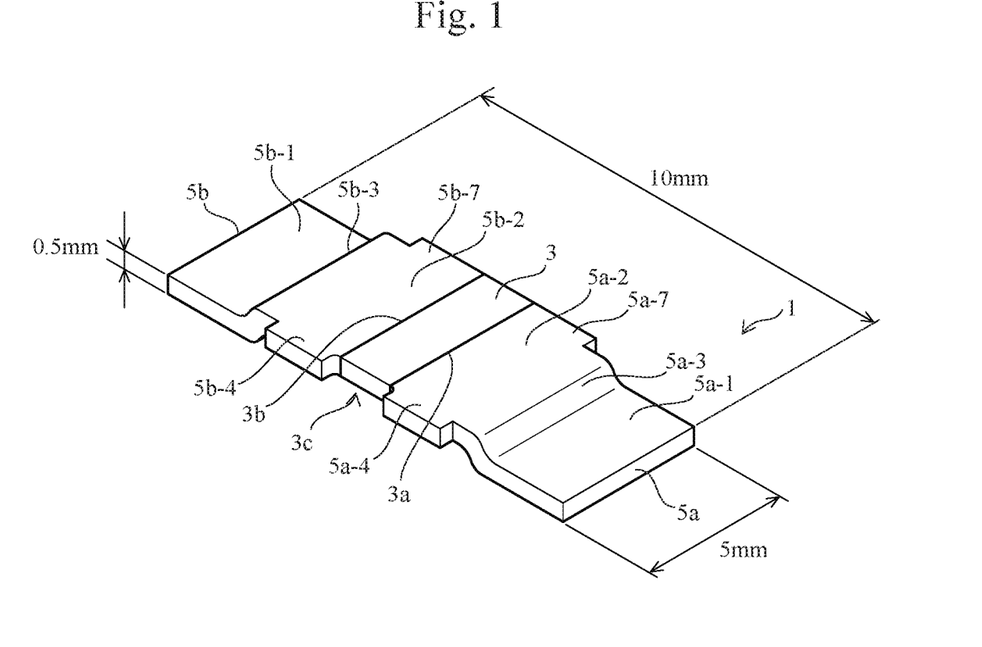
FIG. 1 is a perspective view of an exemplary configuration of a current sensing device according to the first embodiment of the present invention.
Figure 2:
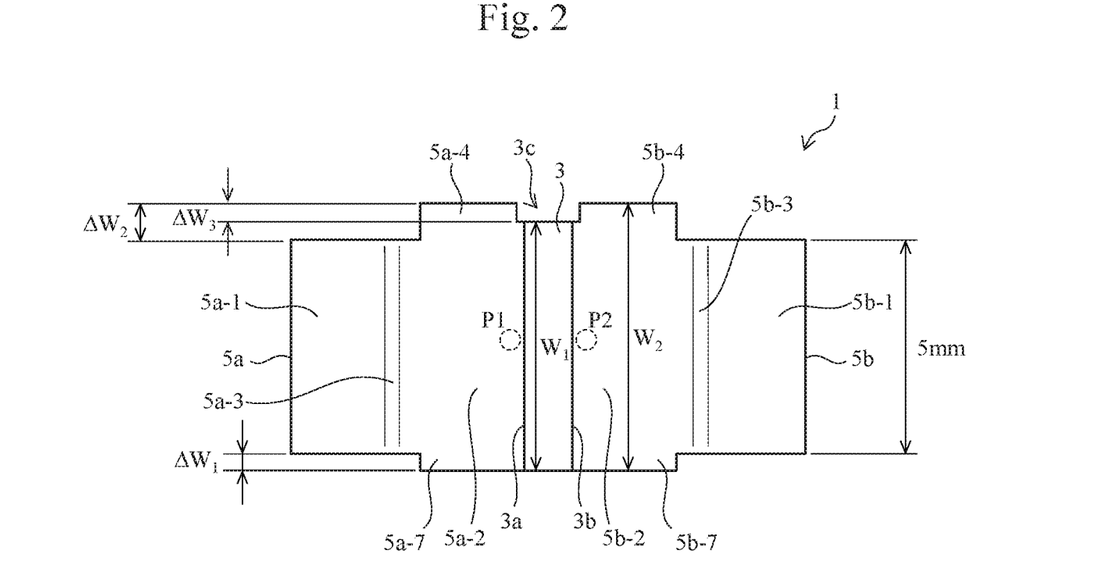
FIG. 2 is a plan view of the current sensing device corresponding to FIG. 1.

FIG. 1 is a perspective view of an exemplary configuration of a current sensing device according to the first embodiment of the present invention. FIG. 2 is a plan view of the current sensing device corresponding to FIG. 1. The dimensions illustrated in the drawings are only exemplary and are not limited thereto. In addition, sizes illustrated in the drawings are also only exemplary.

A current sensing shunt resistor 1 according to the present embodiment includes a plate-shaped resistive element 3 made of a Cu—Ni-based material, for example, and first and second electrodes 5a and 5b made of Cu, for example, for flowing a current across opposite ends of the current sensing resistor having the resistive element 3. The shunt resistor 1 exemplarily illustrated herein is a resistor with a so-called butt joint structure in which a resistive element and electrodes are butt joined together at joined faces 3a and 3b, but the shunt resistor 1 is not limited to such a resistor with a butt joint structure.

The first and second electrodes 5a and 5b have first and second step portions 5a-3 and 5b-3, respectively. First and second end-side electrodes (i.e., lower electrode portions) 5a-1 and 5b-1 are provided on the sides closer to the ends than are the first and second step portions 5a-3 and 5b-3. First and second resistive-element-side electrodes (i.e., upper electrode portions) 5a-2 and 5b-2 are provided on the sides closer to the resistive element 3 than are the first and second step portions 5a-3 and 5b-3. Symbols P1 and P2 represent exemplary wire bonding positions.

The first and second resistive-element-side electrodes (i.e., upper electrode portions) 5a-2 and 5b-2 are wider than the resistive elements 3 and the first and second end-side electrodes (i.e., lower electrode portions) 5a-1 and 5b-1 in the direction orthogonal to the direction in which the electrodes are arranged ($W_2 > W_1$).

As the electrode areas of the first and second resistive-element-side electrodes (i.e., upper electrode portions) 5a-2 and 5b-2, which are closer to the resistive element 3, are made wider, the resistance of the electrodes at positions where wire bonding is to be performed can be reduced. Thus, the contribution of the resistance values of the electrode portions to the resistance value of the entire shunt resistor can be reduced and the influence of TCR of the electrode portions can be suppressed (i.e., temperature characteristics can be improved).

As the electrode portions 5a-2 and 5b-2 in contact with the resistive element 3 are made wider than the resistive element 3 as described above by forming protruding portions 5a-4 and 5b-4 and protruding portions 5a-7 and 5b-7, the resistance values of such portions can be reduced. This will reduce the proportion of the contribution of the resistance values of the electrode portions to the resistance value of the entire shunt resistor in measurement of a current. Accordingly, the influence of TCR of the electrode portions can be suppressed and the temperature characteristics can thus be improved.

It should be noted that increasing the thickness of each electrode can also obtain a similar advantageous effect. However, a problem would arise that bending of the electrodes is difficult to perform, for example.

As the first and second resistive-element-side electrodes (i.e., upper electrode portions) 5a-2 and 5b-2 are portions that are made wider and floated from the substrate, the first and second end-side electrodes (i.e., lower electrode portions) 5a-1 and 5b-1 need not be changed from the conventional ones, and further, lands for mounting are not needed. In addition, as the first and second resistive-element-side electrodes (i.e., upper electrode portions) 5a-2 and 5b-2, that is, the upper electrode portions are made wider, there will be no influence on the underlying wire pattern.

The resistive element 3 has formed therein a cutout portion 3c that is recessed inward. The cutout portion 3c extends across the entire length of the resistive element 3 in the inter-electrode direction and a part of the lengths of the electrodes 5a and 5b. Providing the cutout portion 3c can finely adjust the resistance value. In this case, bonding areas do not become narrow as long as the cutout portion 3c is formed by performing press work for adjusting the resistance value within the protruding range of the protruding portions 5a-4 and 5b-4 of the upper electrode portions. Therefore, wire bonding can be performed easily. In FIG. 2, each of the dimensions of the protrusions beyond the first and second end-side electrodes (i.e., lower electrode portions) 5a-1 and 5b-1 is represented by $\Delta W_2$. The cutout depth of the cutout portion 3c is represented by $\Delta W_3$. The cutout depth $\Delta W_3$ of the cutout portion 3c is less than or equal to $\Delta W_2$. That is, the cutout portion 3c is formed within the protruding range of the protruding portions 5a-4 and 5b-4. Accordingly, wire bonding areas can be secured even for a small resistor. In addition, cracks of plating, which may occur when the cutout portion 3c is formed through punching after the surface is plated, are prevented from reaching the wire bonding areas. For example, $\Delta W_2$ is about 0.5 mm when the entire width is 5 mm.

In addition, the depth of the cutout (i.e., recess portion) 3c does not reach an imaginary line connecting the opposite side faces of the first and second end-side electrodes (e.g., lower electrode portions) 5a-1 and 5b-1.

On the side opposite to the protruding portions 5a-4 and 5b-4, that is, on the side of the protruding portions 5a-7 and 5b-7, the resistive element 3 and the first and second resistive-element-side electrodes (i.e., upper electrode portions) 5a-2 and 5b-2 are flush with each other, but may be allowed to protrude beyond the first and second end-side electrodes (i.e., lower electrode portions) 5a-1 and 5b-1 by $\Delta W_1$. At least one end side is preferably provided with the protruding portion.

According to such a configuration, the influence of TCR can be suppressed even on the side opposite to the protruding portions 5a-4 and 5b-4, that is, on the side of the protruding portions 5a-7 and 5b-7, as on the side of the protruding portions 5a-4 and 5b-4.

For example, the amount of change in TCR (ΔTCR) is about −8 ppm/K when the entire width of the protruding portions in an area including the protruding portion 5a-4 to the protruding portion 5b-4 is set to 5 mm and $\Delta W_2$ is set to 0.5 mm. That is, providing the protruding portions will change the TCR toward the negative side.

It should be noted that when the surface is plated as described below, plating cracks may occur due to press performed to form the cutout 3c. However, as the depth of the cutout 3c is set within the protruding range of each protruding portion, the cracks are prevented from reaching the bonding areas. This can secure the width of each electrode portion that is in contact with the resistive element 3.

FIGS. 3A-3E illustrate the steps of producing the shunt resistor for the current sensing device according to the present embodiment as illustrated in FIGS. 1 and 2.

Figures 3A, 3B:
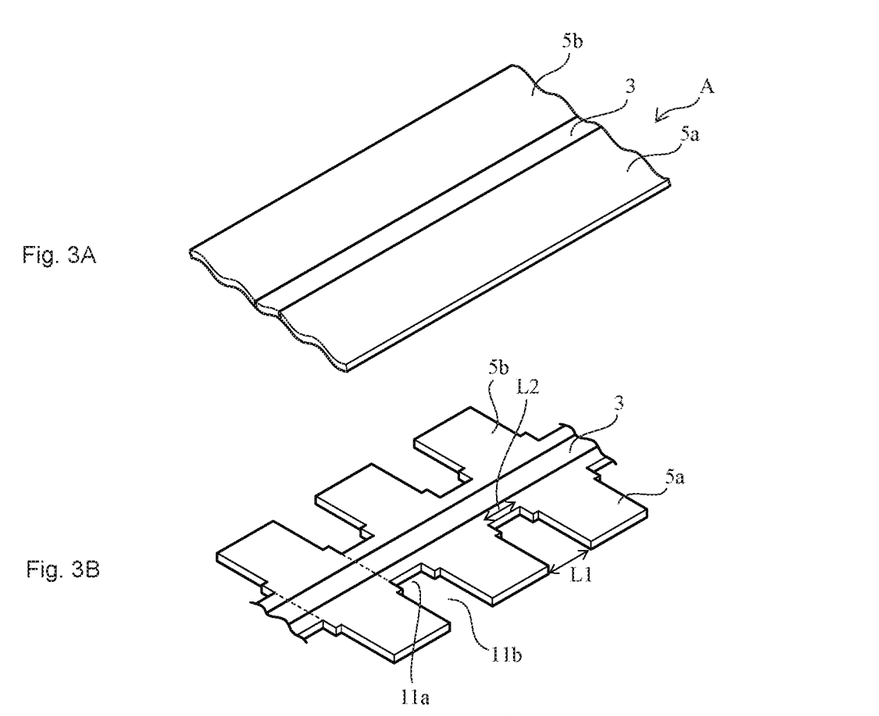
FIGS. 3A-3E illustrate the steps of producing a shunt resistor for the current sensing device according to the present embodiment illustrated in FIGS. 1 and 2.

As illustrated in FIG. 3A, first, a hoop material A is prepared in which a long resistive material 3 and long first and second electrode materials 5a and 5b on the opposite sides thereof are arranged such that their side faces contact one another, and the resistive material and the electrode materials are connected through a welding step using laser, for example.

As illustrated in FIG. 3B, the first and second electrode materials 5a and 5b are partially stamped into predetermined shapes. The shapes of the materials to be removed have a width of L1 at outer ends of the first and second electrode materials 5a and 5b, and a width of L2 (L1>L2) at positions close to the resistive element 3. Accordingly, cutout portions each including a first cutout 11a and its following second cutout 11b are formed on the opposite sides of the first and second electrode materials 5a and 5b.

Figure 3C:
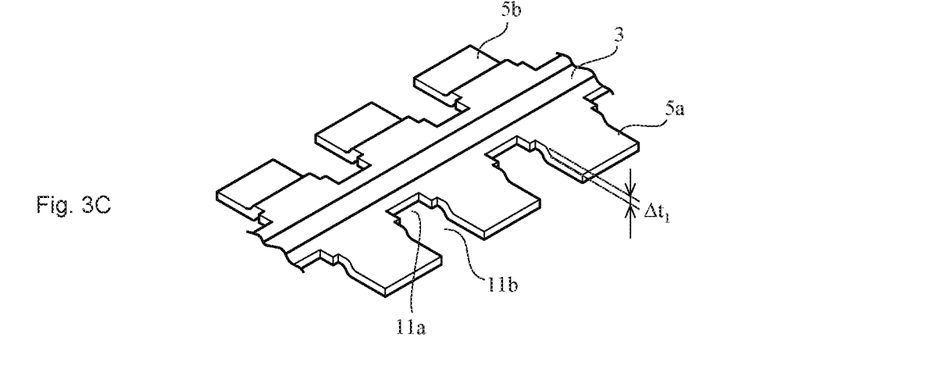

As illustrated in FIG. 3C, areas on the opposite sides of the electrode portions corresponding to the first and second electrodes, surrounded by the cutout portions, are bent downward. The step (i.e., difference in level) of each electrode formed by the bending is indicated by $\Delta_{r1}$.

Figure 3D:
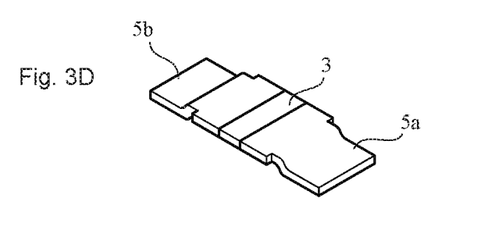

The first and second electrode materials 5a and 5b and the resistive material 3 are cut at desired positions along the inner side faces of the first cutout 11a so as to obtain individual shunt resistors as illustrated in FIG. 3D.

Figure 3E:
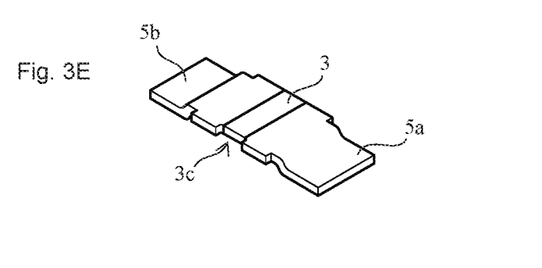

As illustrated in FIG. 3E, the cutout portion 3c, for example, is formed in each shunt resistor through trimming for adjusting the resistance value.

Through the aforementioned steps, the shunt resistor as illustrated in FIGS. 1 and 2 can be formed efficiently.

As described above, according to the shunt resistor of the present embodiment, the influence of TCR of the electrode portions can be suppressed and the temperature characteristics can thus be improved.

Second Embodiment

Next, the second embodiment of the present invention will be described. Although FIGS. 4 to 8 do not illustrate wire bonding positions, such positions may be the same as those in FIG. 2.

Figure 4:
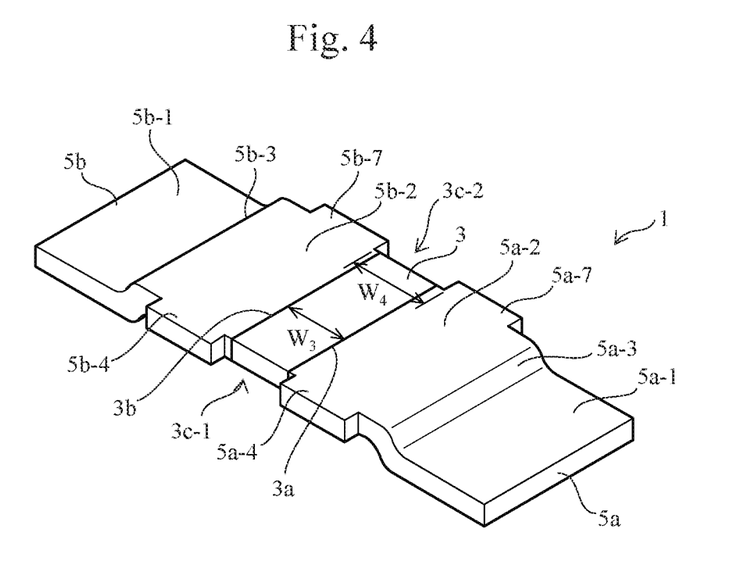
FIG. 4 is a perspective view of a shunt resistor according to the second embodiment of the present invention.

FIG. 4 is a perspective view of the shunt resistor according to the present embodiment. The shunt resistor 1 illustrated in FIG. 4 differs from the shunt resistor illustrated in FIG. 1 in that protruding portions 5a-4, 5a-7, 5b-4, and 5b-7 and cutout portions 3c-1 and 3c-2 are provided on the opposite sides of the resistive element 3. That is, each upper electrode portion is wider than the resistive element and each lower electrode portion in the direction orthogonal to the direction in which the electrodes are arranged, and has protruding portions on the opposite sides thereof. In addition, the width $W_3$ of an area including the resistive element is narrower than the width $W_4$ of each of the cutout portions 3c-1 and 3c-2 that are formed to partially include the upper electrode portions.

According to the present embodiment, the resistance value can be adjusted by performing trimming from the opposite sides of the resistive element 3, as seen in the cutout portions 3c-1 and 3c-2. Therefore, the amount of adjustment of the resistance value can be increased.

Third Embodiment

Next, the third embodiment of the present invention will be described.

Figure 5:
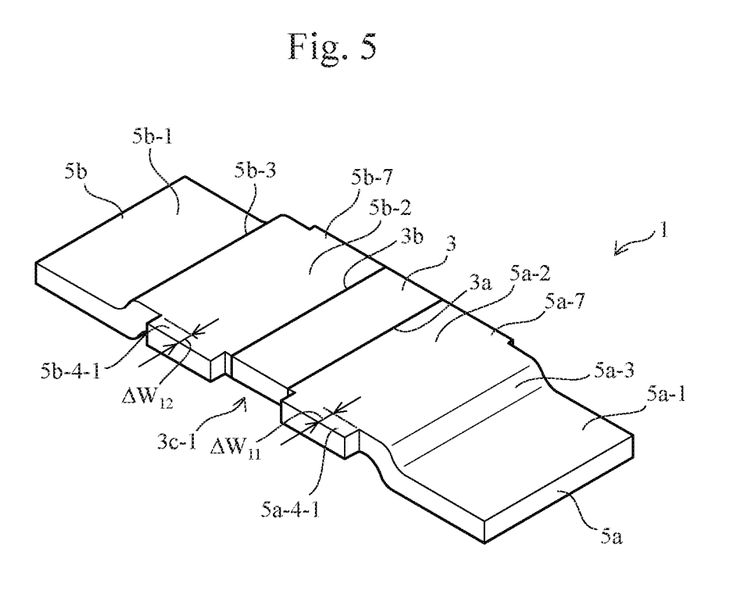
FIG. 5 is a perspective view of a shunt resistor according to the third embodiment of the present invention.
Figure 6:
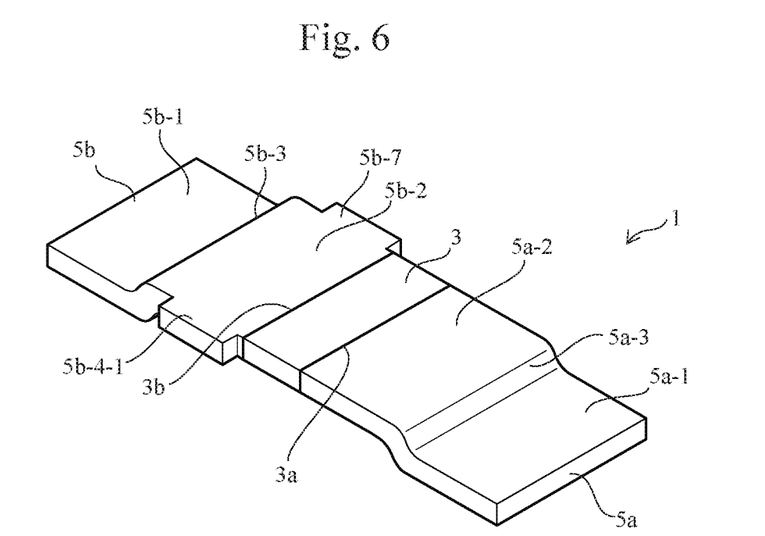
FIG. 6 is a perspective view of a shunt resistor according to a modified example of the third embodiment of the present invention.

FIG. 5 is a perspective view of a shunt resistor according to the present embodiment. The shunt resistor 1 illustrated in FIG. 5 is characterized in that in comparison with the shunt resistor illustrated in FIG. 1, the amount of protrusion ($\Delta W_{11}$) of one protruding portion 5a-4-1 differs from the amount of protrusion ($\Delta W_{12}$) of the other protruding portion 5b-4-1. Accordingly, there is an advantage in that the left side and the right side of the shunt resistor can be clearly distinguished. The example illustrated in FIG. 6 is an exemplary structure in which the one electrode 5a does not have a protruding portion but the other electrode 5b has a protruding portion.

Fourth Embodiment

Next, the fourth embodiment of the present invention will be described.

Figure 7:
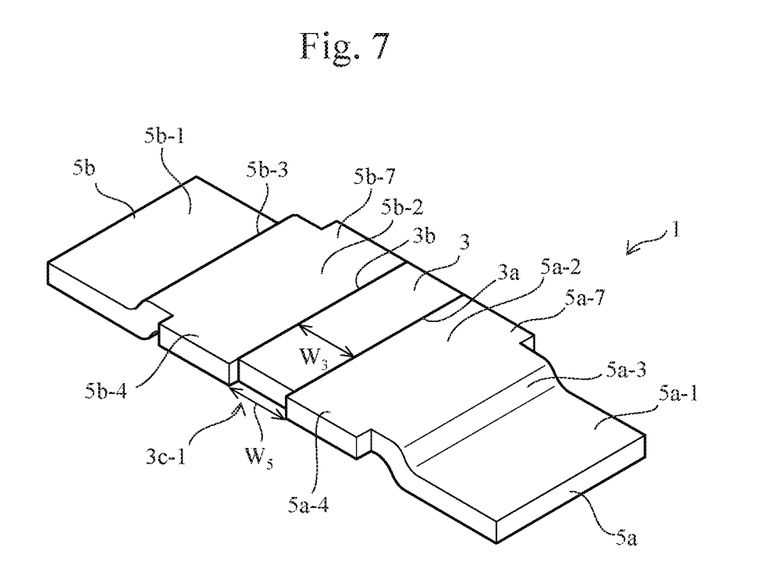
FIG. 7 is a perspective view of a shunt resistor according to the fourth embodiment of the present invention.

FIG. 7 is a perspective view of a shunt resistor according to the present embodiment. The shunt resistor 1 illustrated in FIG. 7 differs from the shunt resistor illustrated in FIG. 1 in that only a portion of the resistive element 3 is cut out to substantially form the protruding portions 5a-4 and 5b-4 on the first and second resistive-element-side electrodes (i.e., upper electrode portions) 5a-2 and 5b-2, respectively. In this example, the width $W_5$ of the cutout is the same as the width $W_3$ of the resistive element.

According to the present embodiment, it is possible to suppress a decrease in the resistance of the electrodes by forming substantial protruding portions on the electrodes on the opposite sides of the resistive element 3 only by partially cutting out the resistive element 3 and by not narrowing the widths of the first and second resistive-element-side electrodes (i.e., upper electrode portions) 5a-2 and 5b-2 in forming the protruding portions.

Fifth Embodiment

Next, the fifth embodiment of the present invention will be described.

Figure 8:
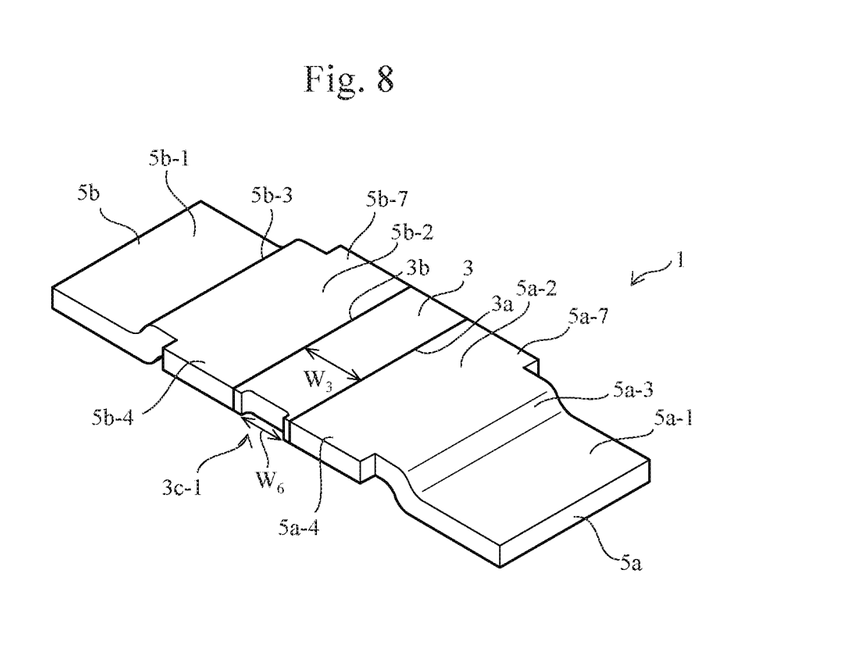
FIG. 8 is a perspective view of a shunt resistor according to the fifth embodiment of the present invention.

FIG. 8 is a perspective view of a shunt resistor according to the present embodiment. The shunt resistor 1 illustrated in FIG. 8 differs from the shunt resistor illustrated in FIG. 7 in that the width $W_6$ of a cutout portion in the resistive element 3 is smaller than the width $W_3$ of the resistive element.

According to the present embodiment, partially cutting out the resistive element 3 can form protruding portions that substantially include only the electrodes.

Sixth Embodiment

Next, the sixth embodiment of the present invention will be described.

Figure 9:
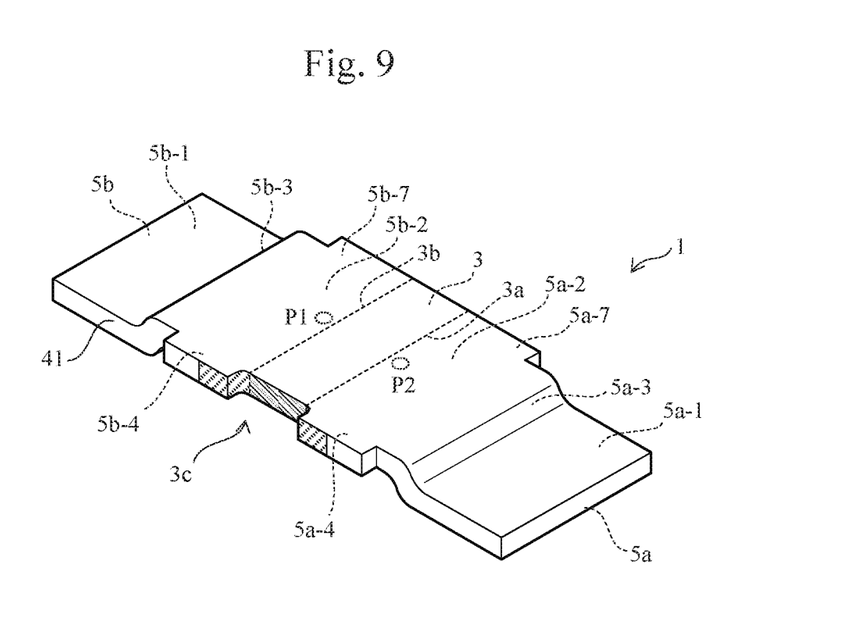
FIG. 9 is a perspective view of a shunt resistor according to the sixth embodiment of the present invention.

FIG. 9 is a perspective view of a shunt resistor according to the present embodiment. The shunt resistor 1 illustrated in FIG. 9 differs from the shunt resistor illustrated in FIG. 1 in that a substantially entire surface is plated with Ni—P, for example, through electroless plating. As the plating step, plating can be performed in the state of FIG. 3C.

Since the base materials are cut into individual shunt resistors after the plating film is formed, the plating film is not formed in the shaded area. Accordingly, the electrodes and the resistive element are exposed on the shaded area, that is, on a part of the side face of the shunt resistor. The same is true of an area of a side face on the side opposite to the shaded area.

It should be noted that plating may be performed after the bate materials are cut into individual shunt resistors.

This structure is a butt joint structure and is entirely covered with a plating film. Therefore, the boundary between the resistive element 3 and each of the electrodes 5a-2 and 5b-2 may not be clearly seen. However, the present embodiment is advantageous in that positioning for wire bonding (P1 and P2) and the actual bonding can be performed since a step (i.e., difference in level), which can serve as a mark of the boundary, is provided between the surface of the resistive element 3 and each of the areas (i.e., upper portions) 5a-2 and 5b-2 of the electrodes 5a and 5b on the side of the resistive element 3 or performed by recognizing an image of the protruding portions 5a-4 and 5b-4. It should be noted that positioning for wire bonding using the protruding portions can be similarly performed for the shunt resistors according to the other embodiments.

It should be noted that a coating 41 may be partially formed. For example, the coating 41 may be formed at a portion where each of the electrodes 5a and 5b is connected to a wire pattern, or at a position where a bonding wire is connected as indicated by each of reference numerals 5a-2 and 5b-2.

Seventh Embodiment

Next, the seventh embodiment of the present invention will be described.

Figure 10:
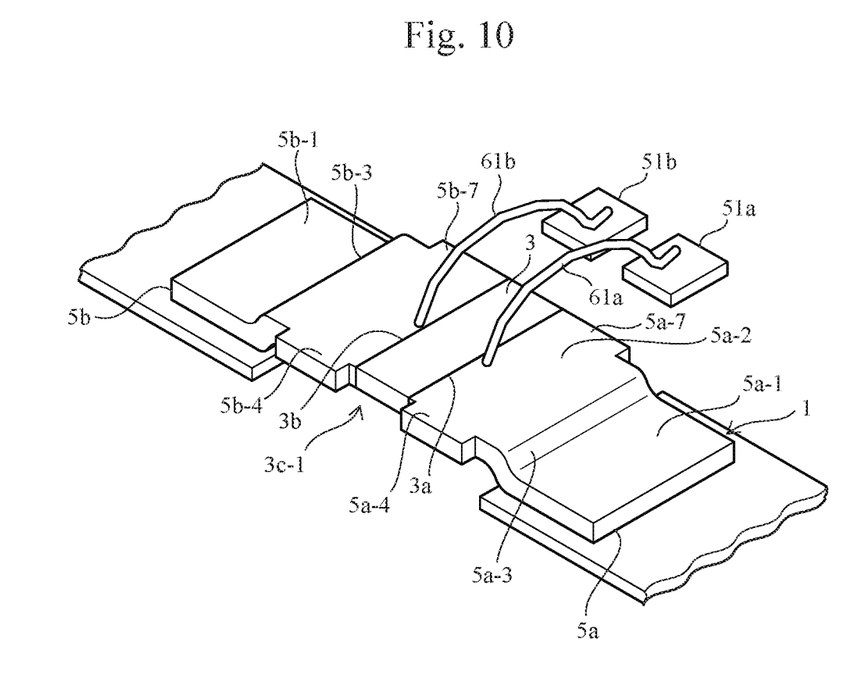
FIG. 10 illustrates an exemplary mount structure of the shunt resistor according to each of the first to sixth embodiments of the present invention.

FIG. 10 illustrates a mount structure of the shunt resistor according to each of the first to sixth embodiments. Performing wire bonding (61a and 61b) for connection between lands 51a and 51b and areas of the electrodes 5a-2 and 5b-2 at positions closer to the resistive element 3, respectively, allows the shunt resistor to be mounted on a substrate, for example.

In the aforementioned embodiments, the configurations and the like illustrated in the accompanying drawings are not limited thereto, and can be changed as appropriate within the range that the advantageous effects of the present invention can be exerted. Besides, the configurations and the like can be changed as appropriate without departing from the spirit and scope of the present invention.

In addition, each element of the present invention can be freely selected or not selected, and an invention including the selected element is encompassed by the present invention.

INDUSTRIAL APPLICABILITY

The present invention is applicable to current sensing devices.

All publications, patents, and patent applications cited in this specification are incorporated by reference into this specification.

What is claimed is:

1. A current sensing resistor comprising:
    a plate-shaped resistive element containing a resistive material, the plate-shaped resistive element being extensive in mutually orthogonal first and second direction, wherein the first direction is parallel to a direction of current flowing, through the current sensing resistor; and
    a pair of plate-shaped electrodes connected through butt joining, respectively, to the opposite sides of the plate-shaped resistive element in the first direction, each of the pair of electrodes containing an electrode material, wherein
    each of the pair of electrodes includes an upper electrode portion extensive in a first plane substantially coplanar with the resistive element so that the upper electrode portions are but-joined with the resistive element, a lower electrode portion extensive in a second plane different from the first plane, and a step portion configured to contiguously connect the upper electrode portion and the lower electrode portion together along the first direction,
    each of the upper electrode portions is shaped to have an extension extending in the second direction that makes the upper electrode portions wider in the second direction than the resistive element and the lower electrode portion,
    the extension extends in the second direction past the resistive element by a first length and past the lower electrode portion by a second length, wherein the first length is shorter than the second length, and
    a width of the resistive element in the second direction is not less than a width of the lower electrode portion in the second direction.

2. A current measuring device comprising:
    a current sensing resistor; and
    a bonding wire,
    the current sensing resistor comprising:
        a plate-shaped resistive element containing a resistive material, the resistive element being, extensive in mutually orthogonal first and second directions, wherein the first direction is parallel to a direction of current flowing through the current sensing resistor; and
        a pair of plate-shaped electrodes connected through butt-joining respectively, to the opposite sides of the plate-shaped resistive element in the first direction, each of the pair of electrodes containing an electrode material, wherein
        each of the pair of electrodes includes an upper electrode portion extensive in a first plane substantially coplanar with the resistive element so that the upper electrode portions are but-joined with the resistive element a lower electrode portion extensive in a second plane different from the first plane, and a step portion configured to contagiously connect the upper electrode portion and the lower electrode portion together along the first direction,
        each of the upper electrode portions is shaped to have an extension extending in the second direction that makes the upper electrode portions wider in the second direction than the resistive element and the lower electrode portion, the extension extends in the second direction past the
resistive element by a first length and past the lower
electrode portion by a second length, wherein the
first length is shorter than the second length, and
a width of the resistive element in the second direction
is not less than a width of the lower electrode portion
in the second direction,
the bonding wire being fixed to the upper electrode
portion near the resistive element, and
each of the upper electrode portions having the extension
extensive in the first direction from a location of the
fixed bonding wire through the step portion.

\* \* \* \* \*

UNITED STATES PATENT AND TRADEMARK OFFICE
CERTIFICATE OF CORRECTION

PATENT NO. : 11,187,724 B2
APPLICATION NO. : 16/485030
DATED : November 30, 2021
INVENTOR(S) : Tsukahara et al.

It is certified that error appears in the above-identified patent and that said Letters Patent is hereby corrected as shown below:

In the Claims

In Column 8, Claim 1, Line 21, delete "but-joined"
And replace with --butt-joining--

Signed and Sealed this
Eighth Day of February, 2022

Drew Hirshfeld
*Performing the Functions and Duties of the*
*Under Secretary of Commerce for Intellectual Property and*
*Director of the United States Patent and Trademark Office*